(12) United States Patent
Mazuir et al.

(10) Patent No.: US 10,109,774 B2
(45) Date of Patent: Oct. 23, 2018

(54) SHAPED PHOSPHOR TO REDUCE REPEATED REFLECTIONS

(71) Applicant: KONINKLIJKE PHILIPS N.V., Eindhoven (NL)

(72) Inventors: Clarisse Mazuir, San Jose, CA (US); Qingwei Mo, Sunnyvale, CA (US); Mei-Ling Kuo, San Jose, CA (US); Lin Li, Pleasanton, CA (US); Oleg Borisovich Shchekin, San Francisco, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 14/912,211

(22) PCT Filed: Aug. 12, 2014

(86) PCT No.: PCT/IB2014/063865
§ 371 (c)(1),
(2) Date: Feb. 16, 2016

(87) PCT Pub. No.: WO2015/025247
PCT Pub. Date: Feb. 26, 2015

(65) Prior Publication Data
US 2016/0190401 A1    Jun. 30, 2016

Related U.S. Application Data

(60) Provisional application No. 61/867,773, filed on Aug. 20, 2013.

(51) Int. Cl.
*H01L 33/50* (2010.01)
*H01L 23/00* (2006.01)
(Continued)

(52) U.S. Cl.
CPC ............ *H01L 33/505* (2013.01); *H01L 24/97* (2013.01); *H01L 25/0753* (2013.01);
(Continued)

(58) Field of Classification Search
None
See application file for complete search history.

(56) References Cited

U.S. PATENT DOCUMENTS

| 8,916,886 B2 | 12/2014 | Engl et al. |
| 9,099,333 B2 | 8/2015 | Imamura et al. |

(Continued)

FOREIGN PATENT DOCUMENTS

| CN | 102024805 A | 4/2011 |
| DE | 102008025923 A1 | 12/2009 |

(Continued)

OTHER PUBLICATIONS

Dictionary.com "specular," in Dictionary.com Unabridged. Source location: Random House, Inc. http://www.dictionary.com/browse/specular. Available: http://www.dictionary.com/. Accessed: Nov. 25, 2016.*

(Continued)

*Primary Examiner* — Scott R Wilson

(57) ABSTRACT

Pre-formed wavelength conversion elements are attached to light emitting elements and are shaped to reduce repeated occurrences of total internal reflection. The sides of the shaped elements may be sloped or otherwise shaped so as to introduce a change in the angle of incidence of reflected light upon the light extraction surface of the wavelength conversion element. The pre-formed wavelength conversion elements may be configured to extend over an array of light emitting elements, with features between the light emitting elements that are shaped to reduce repeated occurrences of total internal reflection.

16 Claims, 3 Drawing Sheets

(51) Int. Cl.
*H01L 25/075* (2006.01)
*H01L 33/54* (2010.01)
*H01L 33/60* (2010.01)
*H01L 33/62* (2010.01)

(52) U.S. Cl.
CPC ............ *H01L 33/508* (2013.01); *H01L 33/54* (2013.01); *H01L 33/60* (2013.01); *H01L 33/62* (2013.01); *H01L 2224/16225* (2013.01); *H01L 2224/32225* (2013.01); *H01L 2224/73204* (2013.01); *H01L 2924/0002* (2013.01); *H01L 2924/181* (2013.01); *H01L 2933/005* (2013.01); *H01L 2933/0041* (2013.01); *H01L 2933/0058* (2013.01)

(56) References Cited

U.S. PATENT DOCUMENTS

| | | |
|---|---|---|
| 9,099,615 B2 | 8/2015 | Tsutsumi et al. |
| 2008/0290351 A1 | 11/2008 | Ajiki et al. |
| 2010/0019265 A1* | 1/2010 | Sormani ............... H01L 33/505 |
| | | 257/98 |
| 2011/0175117 A1 | 7/2011 | Jagt et al. |
| 2012/0094406 A1* | 4/2012 | Patel ..................... H01L 33/505 |
| | | 438/27 |
| 2013/0113009 A1* | 5/2013 | Kim ........................ H01L 33/60 |
| | | 257/98 |
| 2015/0091035 A1* | 4/2015 | Kim ........................ H01L 33/52 |
| | | 257/98 |

FOREIGN PATENT DOCUMENTS

| | | |
|---|---|---|
| EP | 2363896 A1 | 9/2011 |
| JP | 2008294224 A | 12/2008 |
| JP | 14912211 A | 2/2016 |
| WO | 2009143802 A1 | 12/2009 |

OTHER PUBLICATIONS

Machine Translation of D3 reference DE 102008 025923 A1, 2008.*
EPO as ISA, PCT/IB2014/063865, filed Aug. 12, 2014, "International Search Report and Written Opinion" dated Dec. 19, 2014, 14 pages.
First Office Action dated Dec. 14, 2017, China Application No. 201480046430.5, 17 pages.
Office Action of Japan Patent Office dated Jul. 3, 2018, Japan Application No. 2016-535543, 9 pages.

* cited by examiner

SHAPED PHOSPHOR TO REDUCE REPEATED REFLECTIONS

CROSS-REFERENCE TO RELATED APPLICATIONS

The present application is a § 371 application of International Application No. PCT/IB2014/063865, filed on Aug. 12, 2014 and entitled "SHAPED PHOSPHOR TO REDUCE REPEATED REFLECTIONS," which claims priority to U.S. Provisional Application No. 61/867,773, filed on Aug. 20, 2013. PCT/IB2014/063865 and 61/867,773 are incorporated herein.

FIELD OF THE INVENTION

This invention relates to the field of light emitting devices, and in particular to light emitting devices with wavelength conversion material, such as phosphors.

BACKGROUND OF THE INVENTION

The ever expanding use of semiconductor light emitting devices has produced a highly competitive market for these devices. In this market, performance and price are often significant for providing product distinction among vendors.

One technique for improving the performance of a device is to increase the proportion of the generated light that is actually emitted from the device, and correspondingly reducing the amount of light that is trapped and eventually absorbed within the device. Using a reflector on the surface of the device that is not the light extraction surface is a common technique used to redirect light toward the light extraction surface, as is the use of reflectors on the sides of the device.

FIGS. 1A-1B illustrate the manufacture of example prior art light emitting devices with reflective sides, and FIG. 1C illustrates the emission of light from such a device.

In FIG. 1A, a substrate 110, commonly termed a submount, includes metal traces 120 for coupling an external power source to a light emitting element 150, typically via solder bumps 130. An underfill material 140 provides mechanical support to the light emitting element 150; the underfill material 140 may be reflective.

In this example, a wavelength conversion element 160 is situated above the light emitting surface 155 of the light emitting element 150. The wavelength conversion element absorbs some of the light emitted by the light emitting element 150 and emits light at a different wavelength. A mixture of the light emitted from the light emitting element 150 and the light emitted by the wavelength conversion element 160 exits the device from the light extraction surface 165.

In FIG. 1B, a reflective material 170 is applied to surround the device, so that light that strikes the sides/edges 162 of the wavelength conversion element 160 may be redirected toward the light extraction surface 165.

The substrate 110 may subsequently be sliced/diced to provide singulated devices. Optionally, a protective material, such as epoxy, may be molded or otherwise formed to encapsulate the light emitting device, either before or after the devices are singulated, and may be shaped to provide a particular optical effect.

FIG. 1C illustrates example emissions of light from the extraction surface 165 of the device. The surface 165 forms an interface between the wavelength conversion element 160 and the surrounding medium, and the indices of refraction of the wavelength conversion element and the surrounding medium will define a critical angle for light extraction, and this critical angle will define an escape cone 168 at each point on the surface 165. Light 101, 102 that strikes the surface at an angle relative to normal to the surface that is less than the critical angle (i.e. within the escape cone) will escape through the surface; light 106, 107 that strikes the surface at an angle greater than the critical angle will experience total internal reflection (TIR), and will be reflected away from the light extraction surface 165. As detailed further below, light that is totally internally reflected within the wavelength conversion element 160 is likely to be repeatedly totally internally reflected, and therefore highly likely to be absorbed within the light emitting device.

SUMMARY OF THE INVENTION

It would be advantageous to reduce the amount of light that is absorbed within a light emitting device having a wavelength conversion element, allowing such light to exit the light extraction surface, thereby improving the light extraction efficiency. It would also be advantageous to improve the uniformity of light emitted from an array of light emitting devices with wavelength conversion elements.

To better address one or more of these concerns, in an embodiment of this invention, pre-formed wavelength conversion elements are shaped to reduce repeated occurrences of total internal reflection. The sides of the shaped elements may be sloped or other shaped so as to introduce a change in the angle of incidence of reflected light upon the light extraction surface. The pre-formed wavelength conversion elements may be configured to extend over an array of light emitting elements, with features between the light emitting elements that are shaped to reduce repeated occurrences of total internal reflection.

When light is totally internally reflected within a rectilinear structure, the reflected light that strikes the opposite (parallel) surface will strike it at the same angle of incidence. If the reflected light from the upper or lower surface strikes a side of the rectilinear structure, it will strike it at an angle of incidence that is orthogonal to the angle of incidence on the surface. When the reflected light from the side strikes the upper or lower surface, it will strike it at an angle of incidence that is orthogonal to the angle of incidence on the side. Therefore, light that is reflected from a surface to a side and then to the opposing surface will strike the opposing surface at the same angle of incidence as the original angle of incidence on the first surface. In the example prior art light emitting device, light that is unable to escape the light extraction surface 165 because of total internal reflection will repeatedly strike that surface 165 at the same angle of incidence and be trapped within the light emitting device until it is eventually absorbed. Although a change of angle may occur as the light reenters the light emitting element 150, due to refraction at the surface 155, the symmetric nature of the rectilinear structures 150, 160 will tend to cause repeating total internal reflections.

If the wavelength conversion element is shaped so as to present a non-orthogonal surface between the parallel surfaces, instead of the convention orthogonal side walls, the light reflected from the non-orthogonal surface will not strike the opposing surface at the same angle of incidence. Because the angle of incidence is changed after it is reflected from the non-orthogonal surface, the likelihood of the reflected light eventually striking the light extraction surface within the escape cone is increased, thereby increasing the light extraction efficiency. Alternatively, or additionally, the angle of incidence may be changed by providing a diffuse reflective surface.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

As noted above, the orthogonal nature of conventional pre-formed wavelength conversion elements causes internally reflected light to strike opposing surfaces at the same angle of incidence, leading to a continuous recycling of the reflected light within the light emitting device until it is eventually absorbed. In accordance with aspects of this invention, pre-formed wavelength conversion elements are shaped so as to provide non-orthogonal specularly reflective surfaces, so as to introduce variations in the angle of incidence of internally reflected light. In accordance with other aspects of this invention, the pre-formed wavelength conversion elements are shaped so as to provide one or more diffusely reflective surfaces so as to introduce variations in the angle of incidence of internally reflected light.

In the example embodiments, the reflective surfaces are assumed to be specularly reflective, except as otherwise noted. As the term is used herein, a 'reflective surface' is a surface that reflects light emitted from the light emitting element when the surface is situated in the light emitting device. That is, the material attached to the surface of the wavelength conversion element may be a reflective material that causes the reflection at the surface.

Figure 2A:
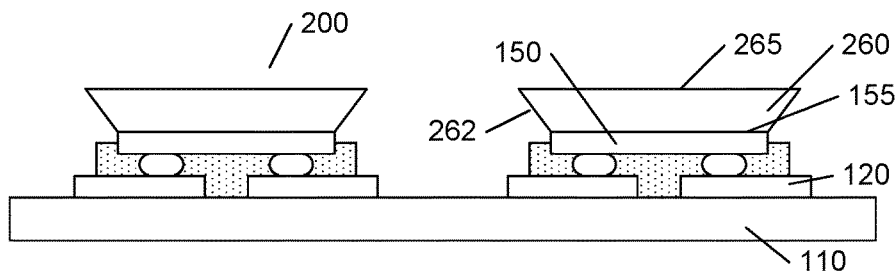
FIGS. 2A-2B illustrate the manufacture of example light emitting devices with shaped wavelength conversion elements.
Figure 2B:
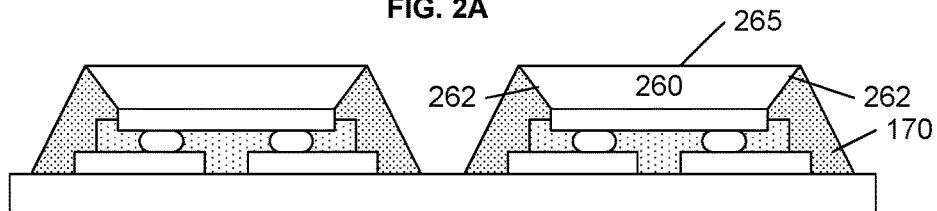

FIGS. 2A-2B illustrate the manufacture of example light emitting devices 200 having shaped wavelength conversion elements 260 with sloped sidewalls 262 that are non-orthogonal to the light extraction surface 265. As illustrated in FIG. 2A, the pre-formed wavelength conversion elements 260 are attached to light emitting surface 155 of the light emitting element 150. Any number of attachment techniques may be used, including, for example, the use of adhesives, bonding, and so on. In some embodiments, the light emitting surface 155 is roughened to enhance the light extraction efficiency from the light emitting element 150.

As illustrated in FIG. 2B, a reflective material 170 is applied so as to reflect light that may strike the sidewalls 262. Because the sidewalls 262 are non-orthogonal to the light extraction surface 265, the reflected light will strike either surface 265 or surface 155 at an angle that is non-orthogonal to the angle of incidence of the light on the sidewall 262.

Figure 1A:
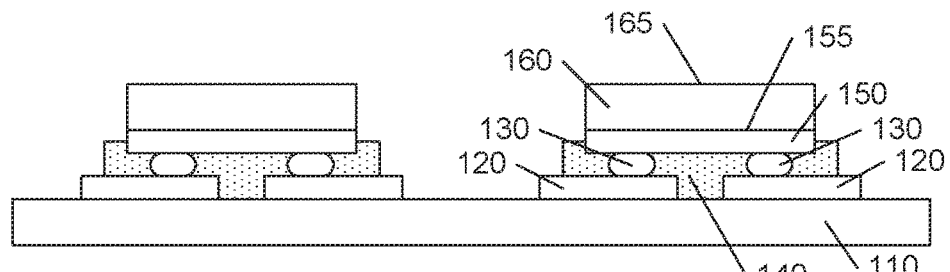
FIGS. 1A-1B illustrate the manufacture of example prior art light emitting devices with reflective sides.
Figure 1B:
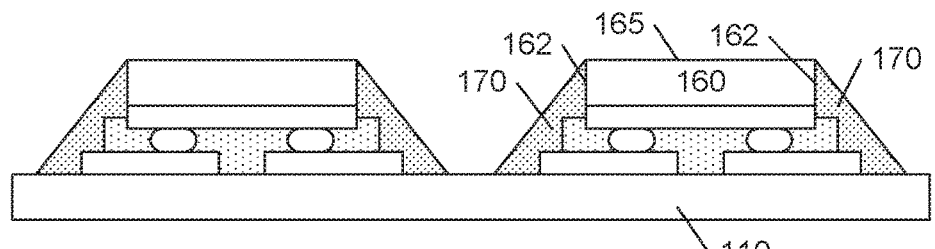
Figure 1C:
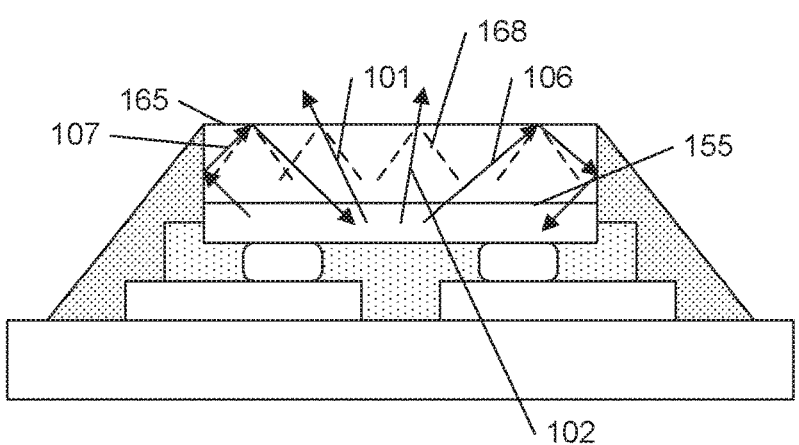
FIG. 1C illustrates example emission from such a device.
Figure 2C:
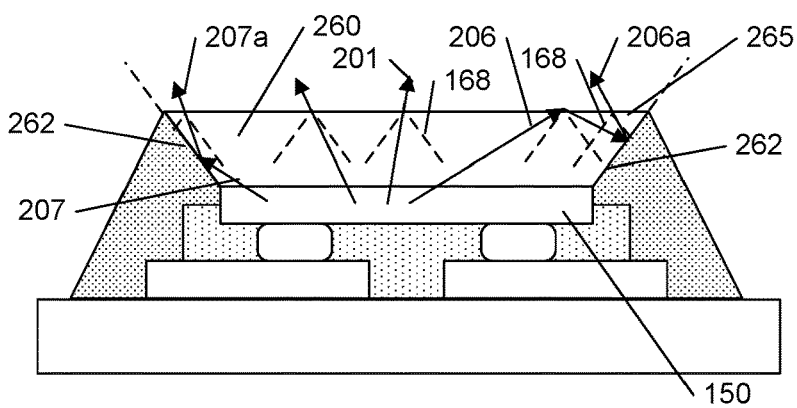
FIG. 2C illustrates example emission from such a device.

FIG. 2C illustrates example emission from the light emitting device 200. As in the example of FIG. 1C, light 201 that strikes the light extraction surface 265 within the escape cone 168 will escape through the surface 265.

Light 206 that strikes the light extraction surface 265 with an angle of incidence that is outside of the escape cone 168 experiences total internal reflection. As contrast with the prior art example of FIG. 1C, when the reflected light is reflected from the non-orthogonal sidewall 262, it does not strike the sidewall 262 at an angle that is orthogonal to the angle of incidence of the light 206 on the extraction surface 265. Consequently, the light that is reflected from the sidewall 262 strikes either surface 265 or surface 155 at an angle of incidence that differs from the angle of incidence of the original internally reflected light 206.

In the example of FIG. 2C, in the case of specular reflection, the internally reflected light 206 is reflected from the sidewall 262 and strikes the extraction surface 265 within the escape cone 168. Because the reflected light now strikes the surface 265 at an angle of incidence within the escape cone 168, it escapes through the surface 265 as light 206a. In like manner, light 207, which would have been internally reflected from the surface 265 if the sidewall 262 were orthogonal to the surface 265, strikes the surface 265 within the escape cone 168 and escapes through the surface 265 as light 207a.

Note that even if the light reflected from the sidewall 262 does not immediately strike the surface 265 within the escape cone 168, subsequent reflections from the sidewall 262 will change the angles of incidence of the light as it subsequently strikes the surface 265, and eventually one of these reflections may strike the surface 265 within the escape cone and escape through the surface 265. Contrarily, prior art light emitting devices with sidewalls that are orthogonal to the extraction surface 165 do not introduce significant changes to the angle of incidence on the surface 165, the likelihood of internally reflected light exiting the surface 165 is substantially nil.

Figure 3:
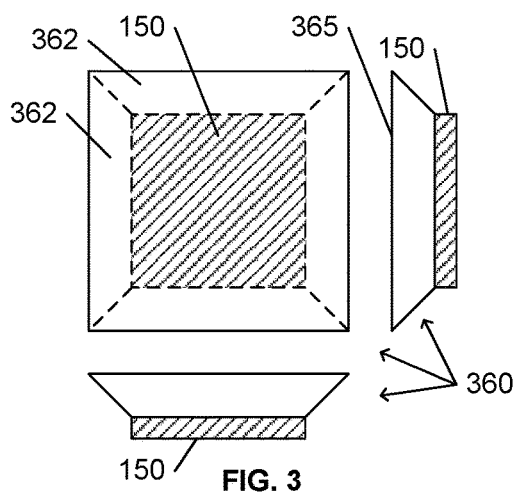
FIG. 3 illustrates an example shape of a pre-formed wavelength conversion element.

FIG. 3 illustrates an example shape of a pre-formed wavelength conversion element. In FIG. 3, each of the four sidewalls 362 of the wavelength conversion element 360 are sloped 'away from' the light emitting element 150, similar to the illustrated sidewalls 262 of FIGS. 2A-2C. However, because the introduction of any non-orthogonal surface in the path of the internally reflected light will introduce a change to the angle of incidence on the light extraction surface, the slope of the sidewalls need not be at any particular orientation.

The pre-formed shapes with non-orthogonal surfaces may be formed using any of a variety of techniques, including sawing, milling, routing, etching, and so on. In some embodiments, the technique used to form the non-orthogonal surfaces may be dependent upon the material used to create the pre-formed wavelength conversion element.

Figure 4:
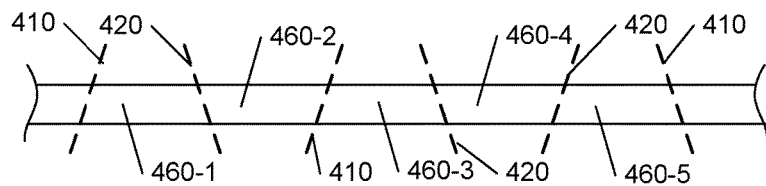
FIG. 4 illustrates an example slicing of a wavelength conversion sheet to form wavelength conversion platelets having non-orthogonal sidewalls.

In some embodiments, a sheet of crystalline material with embedded wavelength conversion particles may be formed and subsequently sliced to create 'platelets' with sloped sidewalls. A conventional saw blade may be oriented so as to provide a mitered cut, such as illustrated in FIG. 4. In this embodiment, the blade is oriented at two angles to make opposing cuts 410, 420, thereby forming platelets 460-1, 460-2, 460-3, 460-4, 460-5, each having a trapezoidal profile.

The introduction of non-orthogonal sidewalls is not limited to platelets situated on individual light emitting elements. FIGS. 5A-5E illustrate example shaped wavelength conversion elements 560a-560e situated on an array of light emitting elements 150a-150d on a substrate 510. Although only one array of light emitting elements is illustrated, the substrate 510 may include a plurality of arrays of light emitting elements. For the purpose of this disclosure, the term "array" is used in a general sense, and includes any ordered arrangement of light emitting elements, including a "line" or "strip" of light emitting elements, a "ring" of light emitting elements, and so on. Of particular note, the array of light emitting elements is arranged such that the location of the light emitting surface of each light emitting element relative to each other is known.

Figure 5A:
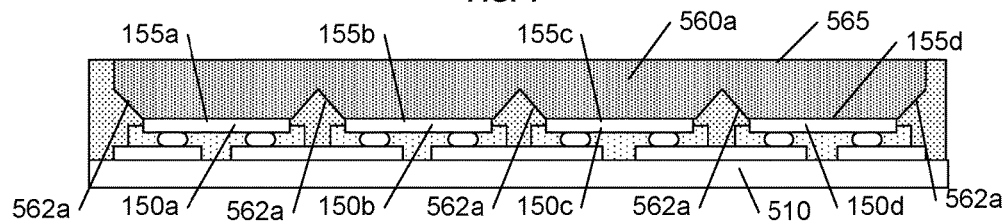
FIGS. 5A-5E illustrate example shaped wavelength conversion elements situated on an array of light emitting elements.

As illustrated in FIG. 5A, a single wavelength conversion element 560a is shaped so as to extend over the light emitting surfaces 155a-155d of an array of light emitting elements 150a-150d mounted on a substrate 510. The substrate 510 may be a submount, a printed circuit board, or other mounting surface. In some embodiments, the substrate 510 may correspond to the wafer upon which the light emitting elements are formed or transferred to during wafer-level processing of the light emitting elements 150a-150d. As noted above, any of a variety of techniques may be used to attach the wavelength conversion element 560a to the light emitting surfaces 155a-155d, and the surfaces 155a-155d may be roughened to enhance light extraction from the light emitting elements 150a-150d.

The wavelength conversion element 560a includes sloped features 562a that are situated between the light emitting surfaces 155a-155d and are not orthogonal to the light extraction surface 565. A reflective material is situated within the crevices formed by the sloped features 562a. In this example, the sloped features 562a are similar in function to the sidewalls 262 of FIGS. 2A-2C. When internally reflected light from the light emitting surface 565 strikes the reflective sloped features 562a, a change is introduced for the subsequent angle of incidence with the extraction surface 565.

Although the sloped features 562a are illustrated as being situated between each light emitting surface 155a-155d, other embodiments may have fewer features, such as sloped features between every other light emitting surface 155a-155d, or a varying concentration of features depending on distances from the center, and so on. The shape and location of features may be based on simulations of optical models, or based on experiments to achieve a desired light output pattern.

It is significant to note that the use of a single phosphor element that extends across multiple light emitting elements facilitates a more uniform distribution of light output than arrays of light emitting devices with discrete phosphor elements. The shape and location of the sloped features may be selected to further enhance this uniformity by enhancing the amount of light that escapes from the regions between the light emitting elements.

Figure 5B:
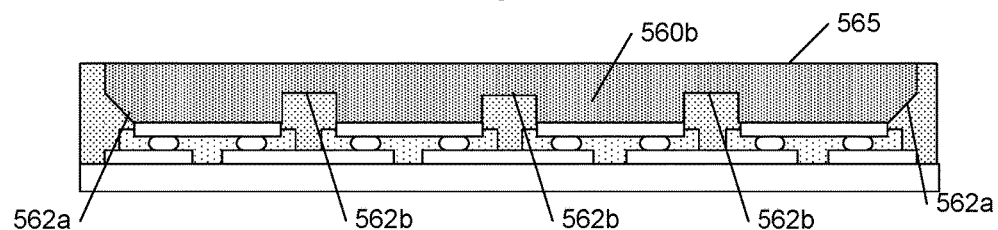

In the example of FIG. 5B, the features 562b are parallel to the upper surface 565, but are created so as to diffusely reflect light that is internally reflected from the surface 565. In addition to providing for a change to the angle of incidence of light that strikes the feature 562b, the diffuse reflections may serve to increase the amount of light that exits the surface 565 in the region above each feature 562b, further enhancing the uniformity of the light output from the surface 565.

In this example, the outer surfaces 562a are specularly reflective and their slope serves to change the angle of incidence of internally reflected light, as in the example of FIG. 5A. One of skill in the art will recognize, however, that the outer surfaces 562a may also be diffusely reflective, obviating the need for a sloped surface.

Figure 5C:
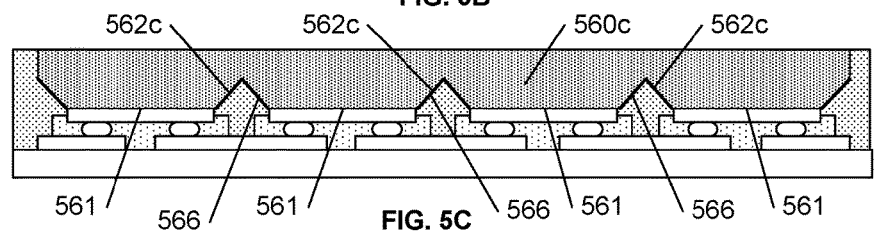

In FIG. 5C, the wavelength conversion element 560c is pre-processed to apply a reflective material 566 within each crevice formed by the sloped features 562c. In some embodiments, a layer of reflective material 566 is applied to the underside of the wavelength conversion element 560c after the features 562c are formed, then removed from the flat portions 561 between the features 562c. In other embodiments, the reflective material 566 is applied via a stencil that covers the flat portions 561. By applying a reflective material 566 to the crevices formed by the features 562c, the efficiency of the device is less dependent upon the application and reflective quality of the underlying material within the crevices.

Figure 5D:
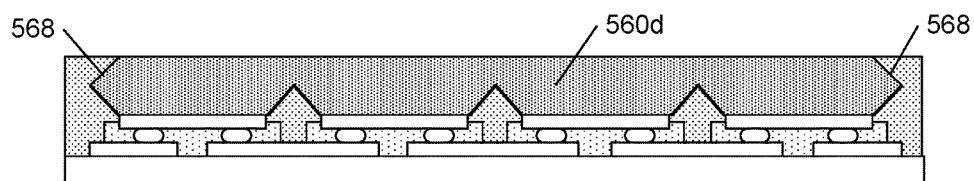

In FIG. 5D, the wavelength conversion element 560d includes sloped walls 568 about the perimeter of the element 560d to reduce the light extraction area and increase the apparent intensity of the light from the device.

Figure 5E:
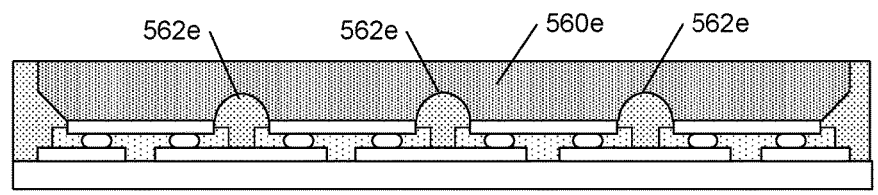

One of skill in the art will recognize that embodiments of this invention are not limited to planar walls and features. In FIG. 5E, the wavelength conversion element 560e includes hemispherical features 562e.

In each of the embodiments 5A-5E, the features 562a-562e may be formed by any of a variety of techniques, including milling or routing with a particularly shaped bit, etching, and so on.

While the invention has been illustrated and described in detail in the drawings and foregoing description, such illustration and description are to be considered illustrative or exemplary and not restrictive; the invention is not limited to the disclosed embodiments.

For example, to take advantage of specular as well as diffuse reflections, one or more of the reflective surfaces may be a surface that provides both specular and diffuse reflections. In such an embodiment, the proportion of specular and diffuse reflection provided by the surface may be selected to further enhance the light output uniformity across the surface of the device.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A light emitting device, comprising:
   light emitting elements comprising light emitting top surfaces, and
   a pre-formed wavelength conversion element including a sheet of wavelength conversion material attached to the light emitting top surfaces of the light emitting elements, the sheet comprising:
   a light extraction top surface, and
   at least one reflective side surface that is neither orthogonal nor parallel to the light extraction top surface, the reflective side surface being at a location between at least two light emitting elements, the reflective side surface comprising a lower edge along a perimeter of a light emitting top surface of one of the at least two light emitting elements.

2. The device of claim 1, including a reflective coating on the reflective side surface and making the reflective side surface reflective.

3. The device of claim 1, wherein the reflective side surface is a sloped planar surface.

4. The device of claim 1, wherein the reflective side surface is specularly reflective.

5. The device of claim 1, wherein the sheet extends continuously across the light emitting elements.

6. The device of claim 5, wherein the sheet comprises reflective side surfaces situated between at least some of the light emitting top surfaces.

7. The device of claim 5, wherein the sheet includes at least one diffusely reflective surface.

8. The device of claim 5, including a reflective coating that is disposed upon the reflective side surface.

9. The device of claim 5, wherein the reflective side surface is a sloped planar surface.

10. The device of claim 5, wherein the sheet comprises a sheet of crystalline material with embedded wavelength conversion particles.

11. A method comprising:
    providing light emitting elements on a substrate, the light emitting elements comprising light emitting top surfaces,
    attaching a pre-formed wavelength conversion element to the light emitting surfaces of the light emitting elements, the pre-formed wavelength conversion element including a sheet of wavelength conversion material having;
    a light extraction top surface, and
    at least one reflective side surface that is neither orthogonal nor parallel to the light extraction surface, the reflective side surface being at a location between at least two light emitting elements, the reflective side surface comprising a lower edge along a perimeter of a light emitting top surface of one of the at least two light emitting elements, and
    applying a reflective material around the pre-formed wavelength conversion element on the substrate, the reflective material making sidewalls of the pre-formed wavelength conversion element reflective.

12. The method of claim 11, wherein the reflective side surface is specularly reflective.

13. The method of claim 11, further comprising pre-forming the pre-formed wavelength conversion element, the pre-forming comprising slicing a wavelength conversion material, the slicing making at least a portion of the reflective side surface sloped.

14. The method of claim 13, wherein the slicing comprises a process selected from a group consisting of sawing, milling, routing, and etching.

15. The method of claim 11, wherein the wavelength conversion material comprises a crystalline material containing embedded wavelength conversion particles.

16. The method of claim 11, wherein the sheet comprises a sheet of crystalline material with embedded wavelength conversion particles.

* * * * *